(12) United States Patent
Jiang et al.

(10) Patent No.: US 6,458,624 B1
(45) Date of Patent: Oct. 1, 2002

(54) RESISTANCE-REDUCING CONDUCTIVE ADHESIVES FOR ATTACHMENT OF ELECTRONIC COMPONENTS

(75) Inventors: Tongbi Jiang; Whonchee Lee, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/946,689

(22) Filed: Sep. 4, 2001

Related U.S. Application Data

(62) Division of application No. 09/561,030, filed on Apr. 28, 2000, now Pat. No. 6,346,750.

(51) Int. Cl.[7] .............................................. H01L 21/50
(52) U.S. Cl. ........................................ 438/108; 257/783
(58) Field of Search .................................. 438/570, 106, 438/108, 118; 428/209, 269, 364; 257/746, 765, 780–784, 777–778

(56) References Cited

U.S. PATENT DOCUMENTS

| | | | | |
|---|---|---|---|---|
| 4,740,657 A | * | 4/1988 | Tsukagoshi et al. | 174/88 R |
| 4,792,476 A | * | 12/1988 | Numata et al. | 428/209 |
| 5,259,992 A | * | 11/1993 | Bennett | 252/518 |
| 5,804,882 A | | 9/1998 | Tsukagoshi et al. | 257/783 |
| 5,815,372 A | | 9/1998 | Gallas | 361/760 |
| 5,855,821 A | * | 1/1999 | Chau et al. | 252/514 |
| 5,959,363 A | | 9/1999 | Yamada et al. | 257/787 |
| 6,027,590 A | | 2/2000 | Sylvester et al. | 156/150 |
| 6,057,381 A | * | 5/2000 | Ma et al. | 522/99 |
| 6,063,828 A | * | 5/2000 | Ma et al. | 522/96 |
| 6,077,380 A | | 6/2000 | Hayes et al. | 156/283 |
| 6,130,170 A | * | 10/2000 | David et al. | 438/745 |
| 6,225,701 B1 | | 5/2001 | Hori et al. | 257/783 |
| 6,264,785 B1 | | 7/2001 | Ikeda | 156/273.3 |
| 6,291,763 B1 | | 9/2001 | Nakamura | 136/256 |

* cited by examiner

Primary Examiner—David Nelms
Assistant Examiner—David Vu
(74) Attorney, Agent, or Firm—Dorsey & Whitney LLP

(57) ABSTRACT

Resistance-reducing conductive adhesives, and apparatus and methods of attaching electronic components using resistance-reducing conductive adhesives are provided. In one embodiment, a resistance-reducing conductive adhesive includes a first quantity of conductive adhesive, and a second quantity of a chelating agent combined with the conductive adhesive. The chelating agent reacts with an oxidized conductive material (e.g. alumina or aluminum ion) on a conductive lead to form soluble conductive metal-ligand complex. The chelating agent may also passivate the oxide-free conductive material by forming hydrogen bonds. The resistance of the resulting electrical connection is reduced in comparison with prior art methods of conductive adhesive coupling, providing improved signal strength, reduced power consumption, and decreased waste heat. In alternate embodiments, the conductive adhesive may include an anisotropically conductive adhesive, an isotropically conductive adhesive, a conductive epoxy, or a hydrophilic adhesive.

18 Claims, 4 Drawing Sheets

RESISTANCE-REDUCING CONDUCTIVE ADHESIVES FOR ATTACHMENT OF ELECTRONIC COMPONENTS

This application is a divisional of pending U.S. patent application Ser. No. 09/561,030, filed Apr. 28, 2000, and issued as U.S. Pat. No. 6,346,750 on Feb. 12, 2002.

TECHNICAL FIELD

The present invention relates to resistance-reducing conductive adhesives, and to apparatus and methods of attaching electronic components using resistance-reducing conductive adhesives.

BACKGROUND OF THE INVENTION

Semiconductor chips (or die) may be mounted to circuit boards or other electronic components in several ways. FIG. 1 shows a die 10 mounted to a circuit board 20 in a "flip chip" or "chip on board" (COB) assembly. In this assembly, the die 10 has a pair of bond pads 12 that are attached directly to a corresponding pair of contact pads 22 on the circuit board 20. The bond pads 12 and contact pads 22 are typically formed from aluminum, although other electrically conductive materials may be used. The bond pads 12 may be attached to the contact pads 22 by soldering or by some other suitable method. Electrical signals from the circuit board 20 may then be transmitted to the internal circuitry (not shown) of the die 10 through the contact pads 22 to the bond pads 12, and vice versa. It is customary to provide an encapsulating layer (or "glob top") 14 over the die 10 to hermetically seal the die 10, thus insulating and protecting the die 10 from humidity, oxidation, and other harmful elements.

It is known to use a layer of conductive material to attach the bond pads of a die to the contact pads of a circuit board, as disclosed in U.S. Pat. No. 5,789,278, and in commonly-owned co-pending patent application Ser. No. 09/389,862, both incorporated herein by reference. For example, FIG. 2 is a partial cross-sectional view of a bumped die 40 attached to a circuit board 20 using an anisotropically conductive layer 50. In this assembly, solder bumps 42 are formed on the bond pads 12 of the die 40. The anisotropically conductive layer 50 is formed between the bond pads 12 and the contact pads 22 on the circuit board 20.

The anisotropically conductive layer 50 includes a plurality of conductive particles 52 distributed in a suspension material 54, providing electrically conductive pathways 56 through the suspension material 54 in one direction (e.g. the "z" direction as shown in FIG. 3). The conductive pathways 56 may be formed, for example, by compressing the solder bumps 42 against the layer 50, causing the conductive particles 52 to contact each other to form columns of conductive particles. Electrical signals are then transmitted from the circuit board 20 to the die 40 through the conductive pathways 56, and vice versa. The layer 50 is electrically insulative all other directions, hence it is "anisotropically" conductive.

Anisotropically conductive layers 50 may be formed in a number of ways, including as a film or as a viscous paste that is applied (e.g. stenciled, sprayed, flowed, etc.) to the circuit board 20 and the contact pads 22. The anisotropically conductive layers 50 may then be cured by, for example, subjecting the suspension material 54 to certain environmental conditions (e.g. temperature, pressure, etc.), exposing to suitable curing compounds, irradiating with ultraviolet or ultrasonic energy, or other means depending on the composition of the suspension material 54. The suspension material 54 may be composed of a variety of materials, including thermoset polymers, B-stage (or "pre-preg") polymers, pre-B stage polymers, thermoplastic polymers, or any monomer, polymer, or other suitable material that is non-conductive and can support the conductive particles 52. Various suspension materials are taught, for example, in U.S. Pat. No. 5,221,417 to Basavanhally and in U.S. Pat. No. 4,737,112 to Jin et al. The conductive particles 52 are commonly formed from silver, nickel, or gold, however, a variety of electrically conductive particles may be used.

Isotropically conductive layers may also be used for attachment of electronic components. For example, FIG. 3 is a partial cross-sectional view of a die 10 having a pair of bond pads 12, each bond pad 12 being attached to corresponding contact pads 22 of a circuit board 20 by an isotropically conductive layer 60. Like the anisotropically conductive layer 50 described above, each isotropically conductive layer 60 includes a plurality of conductive particles 62 suspended in a suspension material 64. The isotropically conductive layer 60, however, is electrically conductive in all directions and therefore does not extend between adjacent bond pads 12 (or contact pads 22) to prevent shorting or erroneous signals. Electrical signals from the circuit board 20 are transmitted through the isotropically conductive layers 60 to the die 10, and vice versa. Both isotropic and anisotropic conductive materials are commercially-available from, for example, Ablestik of Rancho Dominguez, Calif., or A.I. Technology, Inc. of Trenton, N.J., or Sheldahl, Inc. of Northfield, Minn., or 3M of St. Paul, Minn.

Although successful results have been achieved using the above-referenced die packages, there is room for improvement. For example, each of the electrical connections between the bond pads 12 and the contact pads 22 are electrically resistive which may reduce signal strength, increase power consumption, and increase waste heat generation. These characteristics may undesirably degrade the performance of an electronic assembly.

SUMMARY OF THE INVENTION

The present invention is directed to resistance-reducing conductive adhesives, and to apparatus and methods of attaching electronic components using resistance-reducing conductive adhesives. In one aspect, a resistance-reducing conductive adhesive comprises a first quantity of conductive adhesive, and a second quantity of a chelating agent combined with the conductive adhesive. The chelating agent reacts with a metal, typically an oxidized form of the metal such as an oxide or metal ion of a metal-containing conductive lead (or other electronic component) to form a soluble metal-ligand complex. The chelating agent may also react with an oxide-free form of the metal on the conductive lead to passivate the metal by forming hydrogen bonds. The resistance of the resulting electrical connection is reduced in comparison with prior art methods of conductive adhesive coupling, providing improved signal strength, reduced power consumption, and decreased waste heat.

In various alternate aspects, the conductive adhesive may comprise an anisotropically conductive adhesive, an isotropically conductive adhesive, a conductive epoxy, or a hydrophilic adhesive. In other aspects, the chelating agent reacts with a lead comprising another conductive material, particularly a metal. Typically, the metal is a divalent or trivalent metal, including but not limited to, aluminum, copper, gold, nickel, platinum or silver. In a preferred aspect, the metal is aluminum. Alternately, the chelating agents may be any suitable agent that provides the desired reactive mechanisms, including, for example, oxalic acid, malonic acid, citric acid, and succinate succinic acid. In a further aspect, the second quantity of the chelating agent comprises a value within the range from approximately 0.1 percent by weight to approximately 20 percent by weight, inclusive.

In another aspect, an electronic assembly comprises a first component having a first conductive lead formed thereon, a second conductive lead, and a resistance-reducing conductive layer extending between the first conductive lead and the second conductive lead. The resistance-reducing conductive layer comprises a conductive adhesive having a plurality of conductive particles disposed within a suspension material, and a chelating agent approximately uniformly blended with a portion of the conductive adhesive, the chelating agent being chemically reactive with an at least partially oxidized metal ion or metal-oxide to form a soluble conductive metal-ligand complex. The portion of the conductive adhesive may include substantially the whole volume of the conductive adhesive or be a local volume locally disposed between the conductive leads. Alternately, the first component may comprise a die, a circuit board, or any other electronic component.

In yet another aspect, a method of electrically coupling a first conductive lead of an electronic component to a second conductive lead comprises combining a conductive adhesive with a chelating agent to form a resistance-reducing conductive adhesive, the chelating agent being chemically reactive with a metal component of the first or second conductive leads to form a soluble metal-ligand complex, forming a layer of the resistance-reducing conductive adhesive proximate the first and second conductive leads, and engaging the first and second conductive leads with the layer of resistance-reducing conductive adhesive.

DETAILED DESCRIPTION OF THE INVENTION

The present description is generally directed toward resistance-reducing conductive adhesives, and to apparatus and methods of attaching electronic components using resistance-reducing conductive adhesives. Many specific details of certain embodiments of the invention are set forth in the following description and in FIGS. 4–8 to provide a thorough understanding of such embodiments. One skilled in the art will understand, however, that the present invention may have additional embodiments, or that the present invention may be practiced without several of the details described in the following description. Although a variety of electronic components may be attached in accordance with the invention, to simplify the description to allow the reader to focus on the inventive aspects, several of the following embodiments of the invention are described in terms of a semiconductor die attached to a printed circuit board.

Figure 4:
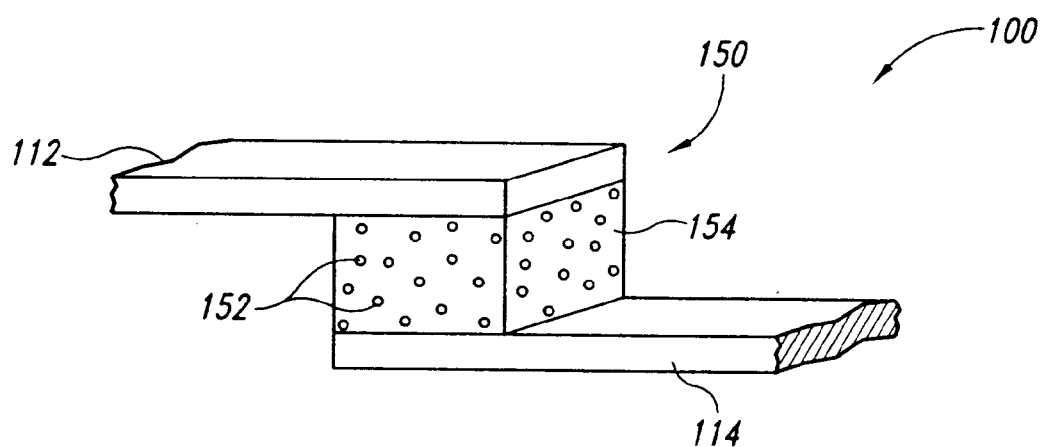
FIG. 4 is a partial cross-sectional view of an electrical connection having a first conductive lead coupled to a second conductive lead using a resistance-reducing conductive layer in accordance with an embodiment of the invention.

FIG. 4 is a partial cross-sectional view of an electrical connection 100 having a first conductive lead 112 coupled to a second conductive lead 114 using a resistance-reducing conductive layer 150 in accordance with an embodiment of the invention. In one embodiment, at least one of the first lead 112 and the second lead 114 are formed of divalent or trivalent metal. In preferred embodiments, at least one lead, or preferably both leads, are formed of aluminum. The resistance-reducing conductive layer 150 includes a plurality of conductive particles 152 distributed in a modified suspension medium 154. The modified suspension medium 154 includes a suspension material 54 arid a chelating agent 156. The chelating agent 156 is approximately uniformly blended into the suspension material 54, and chemically reacts with the conductive lead in the first and second leads 112, 114, reducing the electrical resistivity of the electrical connection 100 compared with the prior art electrical connections described above.

In one embodiment, the resistance-reducing conductive layer 150 includes a commercially-available anisotropically conductive adhesive, specifically, a product known as Ablebond® 8360 distributed by Ablestik Electronic Materials & Adhesives of Rancho Dominguez, Calif. Ablebond® 8360 includes silver particles suspended in an epoxy-type suspension material 54. As a chelating agent 156, a quantity of oxalic acid may be added to the Ablebond® 8360 to form the resistance-reducing conductive layer 150. Oxalic acid is commercially-available from a variety of sources, including, for example, Integra Chemical Company of Renton, Wash.

It should be noted that a variety of chelating agents other than oxalic acid may be used, including but not limited to polydentate ligands. Typical polydentate ligands include compounds having dihydroxy, hydroxy-ketone, hydroxy-acid, diketone, and diacidic structures. Preferred polydentate ligands include for example, oxalic acid, malonic acid, a citric acid, and succinate succinic acid. Oxalite, malanolite citriatic and succinatic derivatives of these ligands are also useful. As used herein, oxalitic, malanolite, citriatic or succinatic derivatives include compounds containing an oxalate, malonate, citrate or succinate moiety, respectively, which have the ability to chelate a metal. Other typical polydentate ligands include for example, ethylenediamine, acetylacetonoate, ethylenediaminetetraacetate (EDTA) hydroxyethyl ethylenediaminetetriacetate (HEDTA), glycine, and polyphosphates such a pyrophosphate or triphosphate.

The amount of chelating agent 156 included in the resistance-reducing conductive layer 150 may vary depending upon the composition of the suspension material 54, the composition of the chelating agent 156, the composition of the first and second leads 112, 114, or other factors. For most applications, however, it is believed that the chelating agent 156 will comprise between approximately 0.1 % to 20% by weight of the resistance-reducing conductive layer 150, although other quantities of chelating agent may be used. In one embodiment, the resistance of the electrical connection 100 having first and second conductive leads 112, 114 electrically coupled using the resistance-reducing conductive layer 150 composed of 90% Ablebond® 8360 (by weight) and 10% oxalic acid (by weight) was reduced by about 30% compared with a control connection formed using only Ablebond® 8360.

Figure 5A:
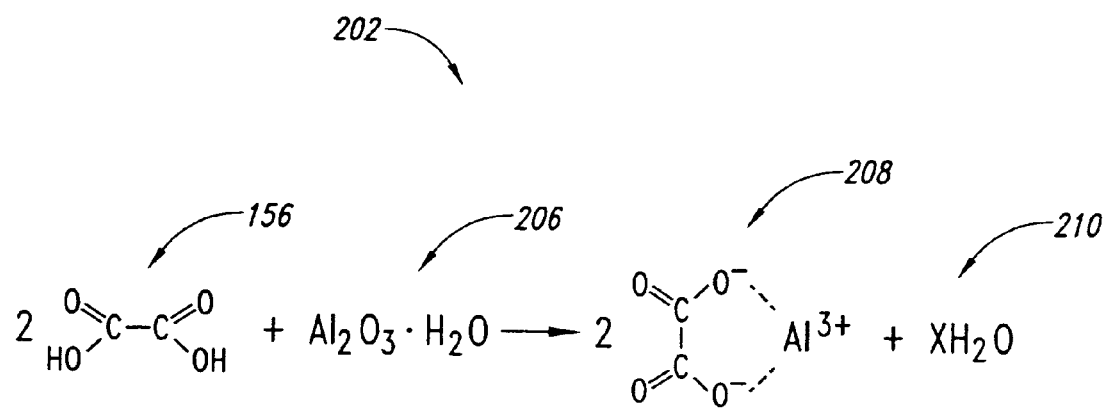
FIG. 5A is a schematic representation of a first mechanism of a resistance-reducing reaction in accordance with an embodiment of the invention.
Figure 5B:
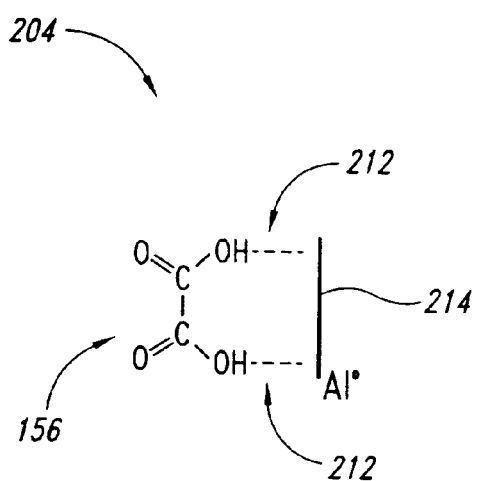
FIG. 5B is a schematic representation of a second mechanism of resistance-reducing reaction in accordance with an embodiment of the invention.

FIGS. 5A and 5B are schematic representations of first and second mechanisms 202, 204, respectively, of a resistance-reducing reaction 200 in accordance with one embodiment of the invention. FIG. 5A schematically shows the first mechanism 202 involving a removal of aluminum oxide 206 from the surfaces of the first and second aluminum leads 112, 114 by forming a soluble aluminum-ligand complex 208. While not being bound by theory, the chelating agent 156 (in this case oxalic acid) is believed to react with the aluminum oxide 206 to produce the soluble aluminum-ligand complex 208 (in this case aluminum-oxalate) and water 210. FIG. 5B schematically shows the second mechanism 204 involving the passivation of oxide-free aluminum 214 by forming hydrogen bonds 212 between the chelating agent and the aluminum. Thus, because the aluminum oxides 206 are removed from the surfaces of the first and second aluminum leads 112, 114, and the oxide-free aluminum surfaces 214 are passivated, the electrical resistance of the electrical connection 100 is reduced.

Although the first and second leads 112, 114 have been described as being aluminum leads, the resistance-reducing conductive layer 150 may be used with leads formed from a variety of metals, including, for example, divalent or trivalent metals such as aluminum copper, gold, nickel, platinum or silver. Also, the leads may be formed from a variety of alloys of conductive materials, including, for example, AlCu (typically 0.5 to 2% of Cu), AlSi (typically 1% Si), or AlSiCu, or other alloys of aluminum, copper, gold, nickel, platinum or silver.

Furthermore, although the resistance-reducing reaction 200 is represented in FIGS. 5A and 5B as having first and second mechanisms 202, 204 involving oxalic acid as the chelating agent, it should be understood that a variety of chelating agents may be included in the resistance-reducing conductive layer 150, and that various chelating agents may involve a greater number of mechanisms than the representative mechanisms shown in FIGS. 5A and 5B and described above. Similarly, the resistance-reducing reaction 200 is not limited to the particular aluminum oxide 206 shown in FIGS. 5A and 5B, but may involve the removal of any number of oxidized forms of the metal, including for example, metal ions.

The resistance-reducing conductive layer 150 advantageously reduces the electrical resistance of the electrical connection 100 compared with the prior art method. Because the modified suspension medium 154 contains a chelating agent 156, the aluminum oxides 206 which exist on the first and second leads 112, 114 are removed by forming a soluble aluminum complex 208, and the resulting oxide-free aluminum is passivated by forming hydrogen bonds 212. The resistance of the electrical connection 100 is lowered, resulting in improved signal strength, decreased power consumption, and decreased waste heat generation.

The resistance-reducing conductive layer 150 is not limited to the combination of a chelating agent with Ablebond® 8360. The layer 150 may be formed by combining a variety of chelating agents with a variety of isotropically or anisotropically conductive materials, including those having polymeric adhesive suspension materials, as long as the components of the suspension materials, or the solvents or curing agents used to cure the suspension materials, do not alter the chelating agent or inhibit the mechanisms of the resistance-reducing reaction. Conductive adhesives formulated with hydrophilic components (e.g. epoxies) or a hydrophilic solvent/diluent (e.g. butyrolactone) may desirably increase the solubility of the chelating agent, improving the distribution of the chelating agent within the layer 150, and thus, the uniformity of the resistance-reducing reaction between the layer and the leads.

Figure 6:
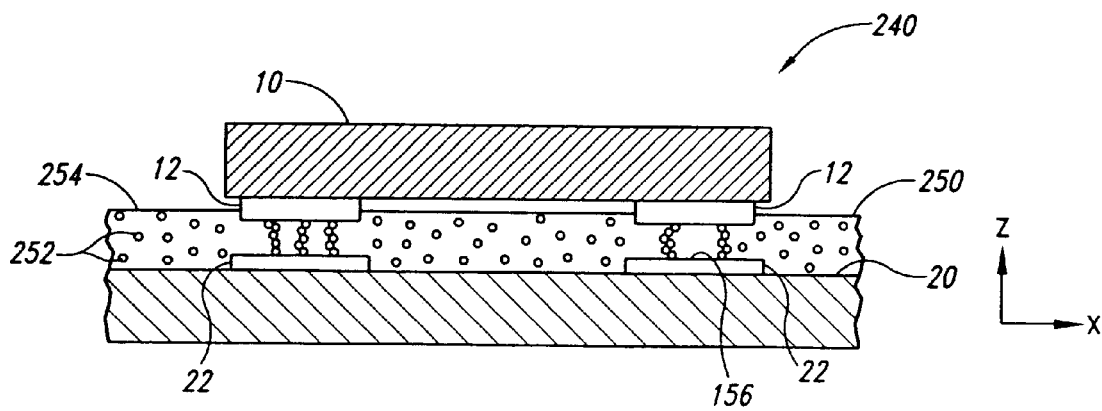
FIG. 6 is a partial cross-sectional view of an electronic assembly having a resistance-reducing anisotropically conductive layer in accordance with an alternate embodiment of the invention.

FIG. 6 is a partial cross-sectional view of an electronic assembly 240 having a resistance-reducing anisotropically conductive layer 250 in accordance with an alternate embodiment of the invention. As shown in FIG. 6, the electronic assembly 240 includes a die 10 having a pair of bond pads 12 electrically coupled to a corresponding pair of contact pads 22 of a circuit board by a resistance-reducing anisotropically conductive layer 250. The resistance-reducing anisotropically conductive layer 250 includes a plurality of conductive particles 252 suspended in a modified suspension material 254, formed as described above from a combination of a chelating agent 156 and a known anisotropically conductive adhesive (e.g. Ablebond® 8360). In one embodiment, the chelating agent 156 is blended approximately uniformly within a portion of the conductive adhesive locally disposed between the conductive leads. In another embodiment, the chelating agent 156 is uniformly blended substantially with whole portion of the conductive adhesive.

Figure 1:
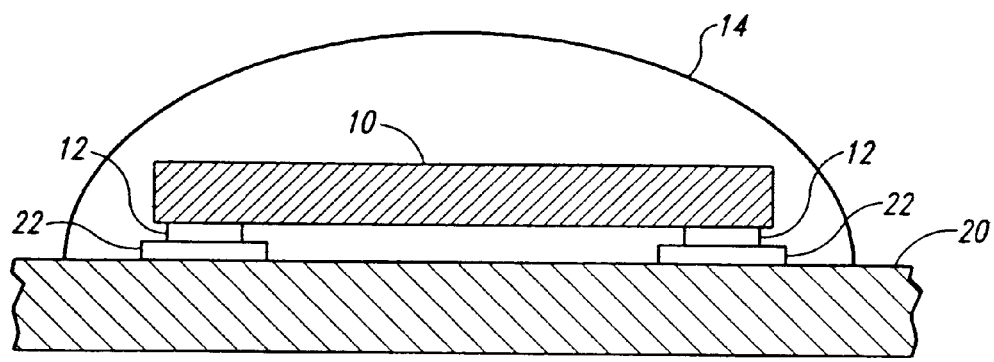
FIG. 1 is a partial cross-sectional view of a die mounted to a circuit board in accordance with the prior art.
Figure 2:
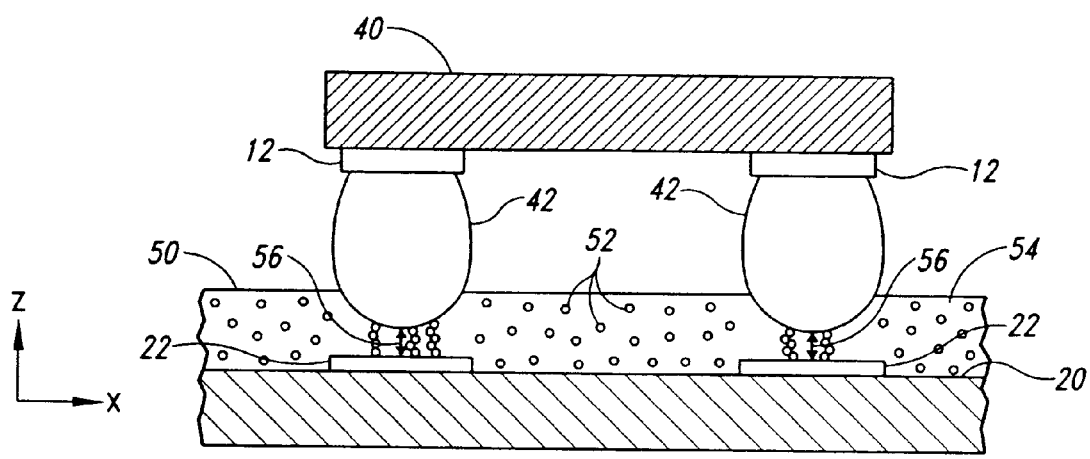
FIG. 2 is a partial cross-sectional view of a die mounted to a circuit board using an anisotropically conductive layer in accordance with the prior art.
Figure 3:
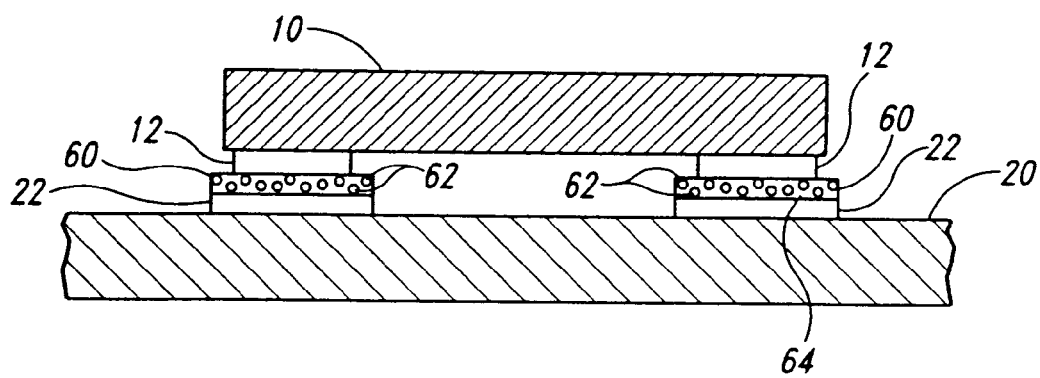
FIG. 3 is a partial cross-sectional view of a die mounted to a circuit board using isotropically conductive layers in accordance with the prior art.

The electronic assembly 240 shown in FIG. 6 advantageously improves the electrical conductivity (reduces the electrical resistivity) of the connections between the bond pads 12 and the corresponding contact pads 22 compared with the prior art method of attachment shown in FIG. 2 and described above. Because the electrical resistance is reduced, the strength of the signals transmitted between the bond pads 12 and the contact pads 22 is improved, the power consumption and the waste heat generated by the electronic assembly 240 is reduced.

Figure 7:
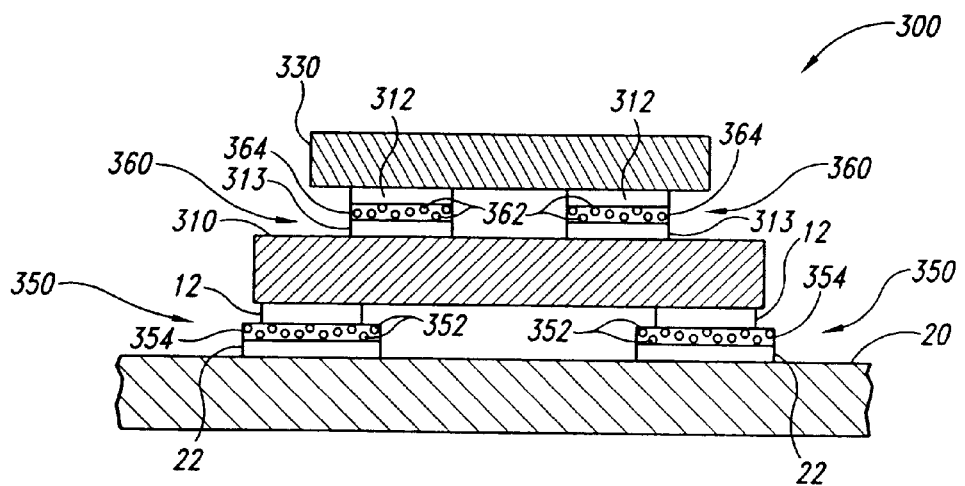
FIG. 7 is a partial cross-sectional view of a stacked die assembly having a plurality of resistance-reducing isotropically conductive layers in accordance with another embodiment of the invention.

FIG. 7 is a partial cross-sectional view of a stacked die assembly 300 having a plurality of resistance-reducing isotropically conductive layers in accordance with another embodiment of the invention. In this embodiment, the stacked die assembly 300 includes an inner die 310 having a plurality of first bond pads 12 electrically coupled to a plurality of corresponding contact pads 22 on a circuit board 20. Each first bond pad 12 is coupled to a contact pad 22 by a first resistance-reducing conductive layer 350 including a plurality of first conductive particles 352 suspended in a first suspension material 354. As described above with respect to the leads 112, 114 shown in FIG. 4, the first bond pads 12 and the contact pads 22, are formed of conductive materials, such as aluminum, copper, gold, nickel, platinum, silver or alloys containing such conductive materials.

The inner die 310 also includes a plurality of second bond pads 313 facing away from the circuit board 20. An outer die 330 having a plurality of third bond pads 312 is positioned on top of the inner die 310, each of the third bond pads 312 being attached to one of the second bond pads 313 of the inner die by a second resistance-reducing conductive layer 360. Again, the second bond pads 313 and the third bond pads 312 are formed of conductive materials, such as aluminum, copper, silver, or gold, or alloys containing such conductive materials. The outer die 330 may send and receive signals from the circuit board through the internal circuitry (not shown) of the inner die 310.

As shown in FIG. 7, the advantages of the resistance-reducing conductive layers 350, 360 may be realized in combination with the space-saving advantages of the stacked die assembly 300. The composition (or properties) of the first resistance-reducing conductive layers 350 may be the same as, or different from, the composition (or properties) of the second resistance-reducing conductive layers 360. For example, the first layers 350 may be isotropically conductive, and the second layers 360 may be anisotropically conductive. Or the first layers 350 may have a higher reflow temperature than the second layers 360 to improve fabrication or reworking of the stacked die assembly 300. Overall, the electrical resistance of the connections between the first bond pads 12 and the contact pads 22, and the second bond pads 313 and the third bond pads 314, are lowered, resulting in improved signal strengths, decreased power consumption, and decreased waste heat generation.

Figure 8:
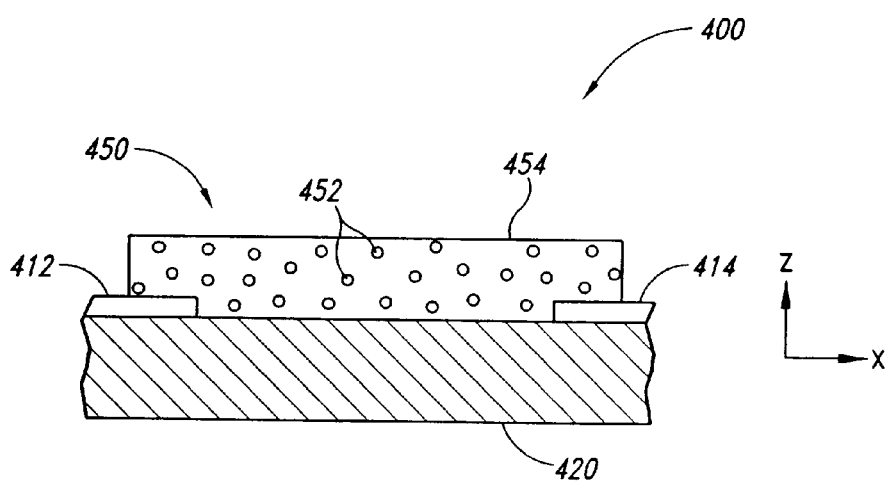
FIG. 8 is a partial cross-sectional view of an electrical connection in accordance with another embodiment of the invention.

FIG. 8 is a partial cross-sectional view of an electrical connection 400 in accordance with another embodiment of the invention. In the embodiment, the electrical connection 400 includes a first conductive lead 412 formed on a substrate 420, and a second conductive lead 414 also formed on the substrate 420. A resistance-reducing conductive layer 450 is formed on a portion of the substrate 420 and on a portion of each of the leads 412, 414. In this embodiment, the resistance-reducing conductive layer 450 may be an isotropically conductive layer, or an "x-axis" anisotropically conductive layer.

In the electrical connection 400, the advantages of resistance-reducing conductive layers are achieved in an embodiment in which the layer and the conductive leads are formed on the same substrate 420. Thus, there is no need to squeeze or pinch the layer 450 between the leads 412, 414 in order to form the desired resistance-reduced electrical connection. The resistance-reducing reaction between the chelating agent and the conductive materials of the conductive leads removes conductive material oxides from the leads 412, 414 and may also passivate the oxide-free lead surfaces, thereby lowering the resistance of the electrical connection 400.

The detailed descriptions of the above embodiments are not exhaustive descriptions of all embodiments contemplated by the inventors to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part to create additional embodiments within the scope and teachings of the invention.

Thus, although specific embodiments of, and examples for, the invention are described herein for illustrative purposes, various equivalent modifications are possible within the scope of the invention, as those skilled in the relevant art will recognize. The teachings provided herein can be applied to other resistance-reducing conductive adhesives, and to other apparatus and methods of attaching electronic components using resistance-reducing conductive adhesives, and not just to the embodiments described above and shown in the accompanying figures. Accordingly, the scope of the invention should be determined from the following claims.

What is claimed is:

1. A method of electrically coupling a first conductive lead of an electronic component to a second conductive lead, comprising:
    combining a conductive adhesive with a chelating agent to form a resistance-reducing conductive adhesive, the chelating agent being chemically reactive with a metal to form a soluble metal-ligand complex;
    forming a layer of the resistance-reducing conductive adhesive proximate the first and second conductive leads; and
    engaging the first and second conductive leads with the layer of resistance-reducing conductive adhesive.

2. The method according to claim 1 wherein combining a conductive adhesive with a chelating agent to form a resistance-reducing conductive adhesive comprises combining an anisotropically conductive adhesive with a chelating agent to form a resistance-reducing anisotropically conductive adhesive.

3. The method according to claim 1 wherein combining a conductive adhesive with a chelating agent to form a resistance-reducing conductive adhesive comprises combining a conductive epoxy with a chelating agent to form a resistance-reducing conductive epoxy.

4. The method according to claim 1 wherein combining a conductive adhesive with a chelating agent to form a resistance-reducing conductive adhesive comprises combining a hydrophilic adhesive with the chelating agent to form a resistance-reducing conductive adhesive.

5. The method according to claim 1 wherein combining a conductive adhesive with a chelating agent to form a resistance-reducing conductive adhesive comprises combining a conductive adhesive with oxalic acid to form a resistance-reducing conductive adhesive.

6. The method according to claim 1 wherein combining a conductive adhesive with a chelating agent to form a resistance-reducing conductive adhesive comprises combining a conductive adhesive with malonic acid to form a resistance-reducing conductive adhesive.

7. The method according to claim 1 wherein combining a conductive adhesive with a chelating agent to form a resistance-reducing conductive adhesive comprises combining a conductive adhesive with citric acid to form a resistance-reducing conductive adhesive.

8. The method according to claim 1 wherein combining a conductive adhesive with a chelating agent to form a resistance-reducing conductive adhesive comprises combining a conductive adhesive with succinic acid to form a resistance-reducing conductive adhesive.

9. The method according to claim 1 wherein combining a conductive adhesive with a chelating agent to form a resistance-reducing conductive adhesive comprises combining a conductive adhesive with an acid selected from the group consisting of an oxalitic, malanolitc, citriatic and succinatic acid, to form a resistance-reducing conductive adhesive.

10. The method according to claim 1 wherein combining a conductive adhesive with a chelating agent to form a resistance-reducing conductive adhesive comprises combining a conductive adhesive with a quantity of chelating agent, the quantity being within the range from approximately 0.1 percent by weight to approximately 20 percent by weight, inclusive.

11. The method according to claim 1 wherein combining a conductive adhesive with a chelating agent to form a resistance-reducing conductive adhesive comprises combining a conductive adhesive with a quantity of chelating agent, the quantity being approximately 10 percent by weight.

12. The method according to claim 1 wherein forming a layer of the resistance-reducing conductive adhesive proximate the first and second aluminum-containing lead and the conductive leads comprises forming a layer of the resistance-reducing conductive adhesive between the first and second aluminum-containing lead and the conductive leads.

13. The method according to claim 1 wherein engaging the aluminum-containing lead and the conductive lead with the layer of resistance-reducing conductive adhesive comprises compressing the layer of resistance-reducing conductive adhesive between the first and second aluminum-containing lead and the conductive leads.

14. The method according to claim 1, further comprising curing the resistance-reducing conductive adhesive.

15. The method according to claim 14 wherein curing the resistance-reducing conductive adhesive comprises heating the resistance-reducing conductive adhesive.

16. The method according to claim 14 wherein curing the resistance-reducing conductive adhesive comprises adding a curing agent to the resistance-reducing conductive adhesive.

17. The method according to claim 1, further comprising adding a hydrophilic solvent to the conductive adhesive.

18. The method according to claim 17 wherein adding a hydrophilic solvent to the conductive adhesive comprises adding butyrolactone to the conductive adhesive.

* * * * *

UNITED STATES PATENT AND TRADEMARK OFFICE
CERTIFICATE OF CORRECTION

PATENT NO.     : 6,458,624 B1
DATED          : October 1, 2002
INVENTOR(S)    : Tongbi Jiang and Whonchee Lee It is certified that error appears in the above-identified patent and that said Letters Patent is hereby corrected as shown below:

Column 1,
Line 56, reads "insulative all other" should read -- insulative in all other --

Column 2,
Line 9, reads "nickel, or gold, however," should read -- nickel or gold; however, --

Column 4,
Line 31, reads "54 arid a" should read -- 54 and a --
Line 55, reads "Oxalitc, malanolitc" should read -- Oxalitic, malanolitic, --
Line 57, reads "malanolitc" should read -- malanolitic --
Line 62, reads "ethylenediaminetetraacetate (EDTA)" should read
-- ethylenediaminetetriacetate (EDTA), --

Column 5,
Line 3, reads "leads 112, 114, or" should read -- leads 112, 114 or --
Line 38, reads "aluminum copper, gold" should read -- aluminum, copper, gold --

Column 6,
Line 23, reads "board by a" should read -- board 20 by a --
Line 34, reads "with whole portion" should read -- with the whole portion --
Line 66, reads "inner die by a second" should read -- inner die 10 by a second --

Column 7,
Line 2, reads "silver, or gold" should read -- silver or gold --
Line 4, reads "circuit board through" should read -- circuit board 20 through --

Column 8,
Line 56, reads "oxalitic, malanolitc," should read -- oxalitic, malanolitic, --

Signed and Sealed this

First Day of July, 2003

JAMES E. ROGAN
*Director of the United States Patent and Trademark Office*